(12) United States Patent
Siracusa et al.

(10) Patent No.: US 11,790,140 B2
(45) Date of Patent: Oct. 17, 2023

(54) METHOD OF REALIZING A HARDWARE DEVICE FOR EXECUTING OPERATIONS DEFINED BY A HIGH-LEVEL SOFTWARE CODE

(71) Applicant: HUXELERATE S.R.L., Milan (IT)

(72) Inventors: Marco Siracusa, Casalmaggiore (IT); Marco Rabozzi, Ameno (IT); Lorenzo Di Tucci, Peschiera Borromeo (IT); Marco Domenico Santambrogio, Cinisello Balsamo (IT); Fabio Pizzato, Milan (IT)

(73) Assignee: HUXELERATE S.R.L., Milan (IT)

( * ) Notice: Subject to any disclaimer, the term of this patent is extended or adjusted under 35 U.S.C. 154(b) by 0 days.

(21) Appl. No.: 17/594,586

(22) PCT Filed: Apr. 23, 2020

(86) PCT No.: PCT/IB2020/053848
§ 371 (c)(1),
(2) Date: Oct. 22, 2021

(87) PCT Pub. No.: WO2020/217201
PCT Pub. Date: Oct. 29, 2020

(65) Prior Publication Data
US 2022/0147675 A1 May 12, 2022

(30) Foreign Application Priority Data
Apr. 26, 2019 (IT) .................. 102019000006380

(51) Int. Cl.
*G06F 30/323* (2020.01)
*G06F 30/343* (2020.01)
(52) U.S. Cl.
CPC .......... *G06F 30/323* (2020.01); *G06F 30/343* (2020.01)

(58) Field of Classification Search
CPC ..... G06F 30/323; G06F 30/343; G06F 30/398
See application file for complete search history.

(56) References Cited

U.S. PATENT DOCUMENTS 10,380,313 B1  8/2019  Schumacher et al.
2008/0295058 A1* 11/2008  Srinivasan .......... G06F 30/3323
                                                          716/104

FOREIGN PATENT DOCUMENTS

WO    WO-2020217201 A1    10/2020

OTHER PUBLICATIONS

J. Zhao, L. Feng, S. Sinha, W. Zhang, Y. Liang and B. He, "COMBA: A comprehensive model-based analysis framework for high level synthesis of real applications," 2017 IEEE/ACM International Conference on Computer-Aided Design (ICCAD), 2017, pp. 430-437, doi: 10.1109/ICCAD.2017.8203809. (Year: 2017).*

(Continued)

*Primary Examiner* — Jack Chiang
*Assistant Examiner* — Aric Lin
(74) *Attorney, Agent, or Firm* — STERNE, KESSLER, GOLDSTEIN & FOX P.L.L.C.

(57) ABSTRACT

This disclosure provides a method to realize a hardware device, in particular a hardware device configured on a FPGA or manufactured as an ASIC, configured to meet maximum performances achievable by a certain algorithm defined by a high-level software code. The method is based on the steps of translating of the high-level software code into a corresponding low-level software code defining low-level operation, for executing the same operations defined by the high-level software code; then on estimating of certain parameters to calculate a peak performance value P and memory transfer performance Pm of the hardware device; finally, on realizing the hardware device with hard- (Continued)

ware resources having performance within the peak performance value P and memory transfer performance Pm.

8 Claims, 3 Drawing Sheets

(56) References Cited

OTHER PUBLICATIONS

Yang Qu and J. .-P. Soininen, "Estimating the utilization of embedded FPGA co-processor," Euromicro Symposium on Digital System Design, 2003. Proceedings., 2003, pp. 214-221, doi: 10.1109/DSD.2003.1231929. (Year: 2003).*

Da Silva, Bruno, An Braeken, Erik H. D'Hollander, and Abdellah Touhafi. "Performance modeling for FPGAs: extending the roofline model with high-level synthesis tools." International Journal of Reconfigurable Computing (2014). (Year: 2014).*

J. Cong, P. Wei, C. H. Yu and P. Zhang, "Automated Accelerator Generation and Optimization with Composable, Parallel and Pipeline Architecture," 2018 55th ACM/ESDA/IEEE Design Automation Conference (DAC), 2018, pp. 1-6, doi: 10.1109/DAC.2018.8465940. (Year: 2018).*

G. Zhong, V. Venkataramani, Y. Liang, T. Mitra and S. Niar, "Design space exploration of multiple loops on FPGAs using high level synthesis," 2014 IEEE 32nd International Conference on Computer Design (ICCD), 2014, pp. 456-463, doi: 10.1109/ICCD.2014.6974719. (Year: 2014).*

Da Silva, B., et al., "Performance Modeling for FPGAs: Extending the Roofline Model with High-Level Synthesis Tools," International Journal of Reconfigurable Computing 2013:428078, 10 pages, Hindawi Publishing Corporation, United States (Jan. 2013).

International Search Report and Written Opinion for International Application No. PCT/IB2020/053848, European Patent Office, Netherlands, dated Aug. 3, 2020, 17 pages.

Oppermann, J., et al., "Domain-specific optimisation for the high-level synthesis of CellML-based simulation accelerators," 2015 25th International Conference on Field Programmable Logic and Applications (FPL), pp. 1-7, Institute of Electrical and Electronics Engineers, United States (Sep. 2015).

Zhao, J., et al., "Comba: A comprehensive model-based analysis framework for high level synthesis of real applications," 2017 IEEE/ACM International Conference on Computer-Aided Design (ICCAD), pp. 430-437, Institute of Electrical and Electronics Engineers, United States (Nov. 2017).

* cited by examiner

METHOD OF REALIZING A HARDWARE DEVICE FOR EXECUTING OPERATIONS DEFINED BY A HIGH-LEVEL SOFTWARE CODE

TECHNICAL FIELD

This disclosure relates to high-level synthesis tools for hardware implementations of algorithms and more particularly to a method of realizing a hardware device for executing operations defined by a high-level software code.

BACKGROUND

The ever increasing demand for computing performance and energy efficient solutions in both the High Performance Computing (HPC) and cloud contexts is leading toward the adoption of heterogeneous systems. Among the hardware accelerators available on the market, Field-Programmable Gate Arrays (FPGAs) offer, on one hand, an appealing trade-off between performance and power efficiency and, on the other, a flexible solution thanks to their reconfigurability feature. Despite its benefits, one of the main limiting factors to the widespread adoption of the FPGA technology is its complexity in programmability [1]. On the other hand, Application Specific Integrated Circuits (ASICs) provide the best power-performance profile but at the cost of even higher development and design time, while lacking the reconfigurability feature typical of FPGAs. Nowadays, High-Level Synthesis (HLS) tools are widely employed in order to consistently reduce the hardware design time compared to a more traditional development with Hardware Description Languages (HDLs). The designer starts from a high-level representation of an algorithm (e.g. C/C++) and can specify several optimization directives referring to specific portions of the code. Such directives, often given in the form of pragmas, allow to define high-level architectural choices for implementing the corresponding kernel. Although this approach is quite effective in terms of obtained performance/design time ratio, HLS tools still require a consistent amount of time for generating the final design. Moreover, the performance of the final design mainly depends on the experience of the user in selecting the best set of optimization directives.

For this reason, several works have been proposed for automating the Design Space Exploration (DSE) of HLS optimization directives [2]-[5], proposing a variety of methods to achieve optimal kernel designs in a relatively short amount of time. Despite the quality of the search method used, such works either do not explicitly consider the memory transfer to and from the off-chip memory or assume that the kernel inputs and outputs can be fully cached on-chip. As a consequence, when the kernel communicates to an off-chip DDR memory, e.g. through AXI interfaces as in the SDAccel design flow from Xilinx [6], inefficiencies in memory transfers can easily jeopardize the effectiveness of the optimization directives. Hence, before optimizing the kernel itself, it is important to identify where the current performance bottleneck resides. HLS tools provide directives that allow exploring several hardware implementations of a software description of an algorithm. Despite HLS directives allow to improve the hardware design from a computational perspective, in most cases the optimization of the memory transfer requires code restructuring by the designer. This aspect limits the effectiveness of DSE approaches that only target HLS directives.

In this context, the roofline model [7], [8] can be used to analyze the performance bounds of a certain application running on a specific architecture. By means of this analytical model, it is possible to quickly verify if the algorithm is memory bound and whether the designer should restructure the code and apply memory transfer optimizations before looking into compute-specific optimization directives.

Hereinafter a survey of the related works according to automated exploration of HLS directives and roofline model analysis is given.

A. Automatic HLS Code Optimization

Several works in literature propose methodologies for efficiently exploring HLS optimization directives in different settings [2]-[5]. In detail, [4] performs several preliminary HLS runs on a set of sample designs derived from the target code. The HLS resource and performance reports are used as the bases of an analytical linear model to drive the DSE. The analytical model is parametrized with respect to the loop hierarchy of the algorithm, providing estimations on a categorization of the application rather than the algorithm itself. Furthermore, the tool relies on the execution of an underlying HLS tool, which, according to the target code, might require a significant amount of time to run. Other approaches like COMBA [2] and Lin-Analyzer [3] do not require external HLS tools. In particular, Lin-Analyzer leverages on dynamic data-dependence graphs obtained from program traces to derive the resource and performance estimations needed by the DSE. On the other hand, COMBA performs static code analysis directly on the LLVM [9] Intermediate Representation (IR) generated from the Clang frontend [20]. It constructs a hierarchical Data-Flow Graph (DFG) of the top function to accelerate and recursively compute resource and performance estimations using analytical models. Both [2] and [3] consider DSP consumption but they do not estimate any LUT usage, which could be the most constraining resource in several scenarios. Besides, both approaches do not consider the effects of code optimizations applied after loop unrolling, such as instcombine and gvn [10], which might significantly reduce the complexity of the code. Hence, despite such approaches provide fairly precise results in estimating the kernel latency, they tend to overestimate resource consumption. Finally, differently from the previous works, [5] takes into account the impact of offchip memory transfer. Nevertheless it is limited to applications with a load-compute-store paradigm whose working set can be cached on-chip.

In our work, we adopt the same model-based approach of COMBA augmented with a preprocessing optimization step comprising both built-in and custom LLVM compiler passes. In this fashion, we are able to explore the design space more accurately and identify solutions that COMBA would consider infeasible due to overestimation of resource requirements.

B. Generalized Roofline Model

One of the first works to adapt the roofline model [7] for FPGA-based architectures is [8] where the authors propose a methodology for building the roofline model relying on the usage of HLS tools. Leveraging the increasing in operational intensity brought by loop unrolling, by means of HLS tools the user can evaluate the performance and resource usage of several unrolled versions, obtaining the roofline model by interpolation. However, this work lacks in automation, both for computing the operational intensity as well as the peak performance. Such limitations are addressed by [11], which presents a tool for semi-automatically building the roofline model for OpenCL kernels. The peak bandwidth and peak performance are computed through benchmarks on the target architecture without considering the computation to accelerate. Nevertheless, FPGAs as well as ASICs allow to define the hardware accelerator according to the computation to perform, hence the assumption of computation-independent peak performance makes the approach less reliable. On the other hand, in [12] the peak performance is computed also considering the input algorithm. Combining the data provided in datasheets, they compute several peak performance values according to two factors: the ratio of floating-point additions and multiplications required by the kernel and the ratio of DSP and LUT resources used for their implementation. Despite this work partially takes into account the algorithm to accelerate, these two factors provide only a coarse-grained classification of the algorithm. Besides, the user has to manually specify the ratio of DSP and LUT usage.

SUMMARY

In order to overcome the discussed limitations, we propose a novel approach to automatically compute the maximum performances achievable by a certain algorithm defined by a high-level software code so as to realize a hardware device, in particular a hardware device configured on a FPGA or manufactured as an ASIC, realized to meet the maximum performances.

The method according to this disclosure is defined in the appended claims and is based on the steps of translating of the high-level software code into a corresponding low-level software code defining low-level operations, for executing the same operations defined by the high-level software code; then on estimating of certain parameters to calculate at least a peak performance value P of a hardware device that can be manufactured or configured to execute the high-level software code; on choosing the hardware device to be manufactured or configured depending upon the respective peak performance value P; finally, on manufacturing or configuring the chosen hardware device to carry out the high-level software code.

According to an aspect of the method of this disclosure, a total number of bytes of data to be transferred to and from a memory of said hardware device when the software code is executed and a maximum bandwidth for transferring data to and from the memory are estimated, then an operational intensity of the low-level software code is calculated. Finally, a memory transfer performance value of the hardware device is calculated as the product of the operational intensity by the maximum bandwidth, and the hardware device to be manufactured or configured is chosen also depending upon the memory transfer performance value.

According to an aspect, the low-level software code is generated by transforming, with a LLVM front-end compiler, for example a Clang front-end compiler or a Flang front-end compiler (https://en.wikipedia.org/wiki/LLVM, https://llvm.org/ProjectsWithLLVM/), the high-level software code into the low-level software code, and by processing the low-level software code with a LLVM compiler for estimating a number of run-time occurrences of each operation and a usage amount of hardware resources, that may be, as a non limiting example, Block RAM, DSP, Flip-Flops, Look Up Tables and area.

According to an aspect, the hardware device is configured on a FPGA or manufactured as an ASIC and the hardware device is realized by executing a Design Space Exploration algorithm on the low-level software code for identifying a suitable FPGA configuration or an ASIC based on the peak performance value and memory transfer performance value to be met.

DETAILED DESCRIPTION

Figure 1:
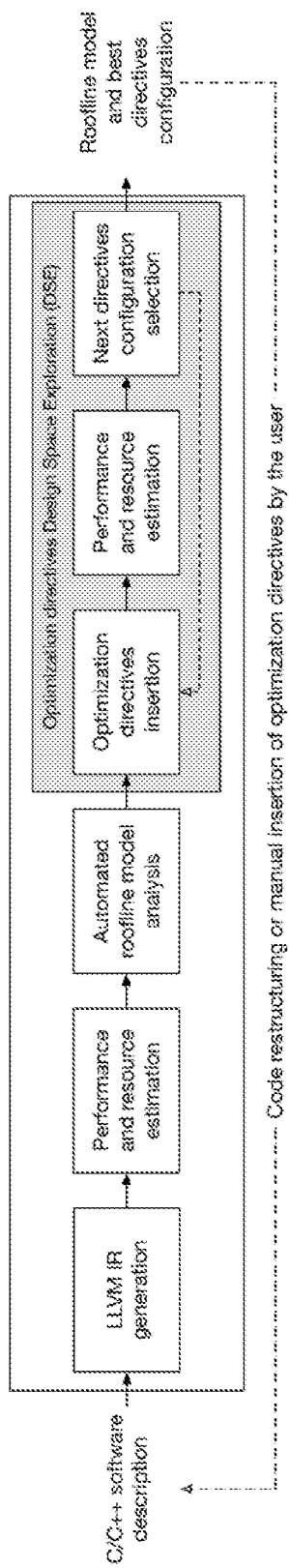
FIG. 1 is a block diagram that illustrates an aspect of the method of the present disclosure.

This disclosure provides a method to realize a hardware device, in particular a hardware device configured on a FPGA or manufactured as an ASIC, realized to meet maximum performances achievable by a certain algorithm defined by a high-level software code. It is also provided a comprehensive methodology to support the designer in the generation of optimal HLS-based hardware implementations.

First, we propose an automated roofline model generation starting from a high-level software code description of the target algorithm. The approach enables a fast evaluation of the operational intensity of the target function and visualizes the main bottlenecks of the current HLS implementation, providing guidance on how to improve it. Second, we present a DSE methodology for quickly evaluating different HLS directives to identify an optimal implementation. We evaluated the DSE on several benchmarks from the PolyBench test suite and achieved performance improvements up to 14.36× compared to previous automated solutions in the literature. Finally, we validated the overall methodology on an N-body physics simulation algorithm and achieved results comparable to bespoke state-of-the-art implementations.

Given these motivations, we propose a comprehensive methodology that combines the roofline model analysis with an automatic DSE to select an optimal set of optimization directives. The novel contributions of this work are:

- an automatic approach to generate a roofline model analysis for a given target hardware device (i.e.: FPGA or ASIC technology) and high-level software code of an algorithm to help designers evaluating performance bottlenecks and offchip memory transfer optimizations and allowing to select the most suitable hardware device within a set of hardware devices according to a given objective function,
- an analytical model to predict the application peak performance bound taking into account both the application to be accelerated as well as the underlying target hardware device,
- an automated DSE of HLS optimization directives driven by fine-grained estimations allowing a thorough exploitation of the available hardware resources.

Section I provides an overview of the proposed methodology, showing how an application designer can benefit from it. Section II illustrates our approach to obtain performance and resource estimations from a given high-level software implementation. Section III reviews the roofline model analysis and discusses how we automated its generation and adapted it for FPGA-based architectures or for a given ASIC technology. Section IV presents a DSE for the identification of optimal HLS directives. Finally, Section V evaluates the proposed methodology.

I. Proposed Approach Overview

Listing 1: Optimizing directives aiming at specifying a certain design configuration

```
// Unrolls and pipelines loop execution
void _loop_unroll_( );
void _loop-unroll_partial_(uint32_t factor);
void _loop_pipeline_( );
// Specifies array partitioning for a
// certain variable and dimension
enum p_type {   BLOCK, COMPLETE, CYCLIC };
void _array_partition_(const void *variable,
    p_type type, uint32_t factor, uint32_t dimension);
// Specifies I/O interface for a function argument
void _axi_master_(void *argument,
    const char *bundle_name);
```

The different steps of our methodology are detailed in FIG. 1. The approach takes as input the target hardware and the target high-level software code (such as C/C++) enriched with optimizing pragmas that resemble the ones from Vivado HLS [13]. We support pragmas specifying loop unrolling, loop pipelining, loop flattening, array partitioning and memory transfer by AXI protocol interface with the format reported in Listing 1. Similar to other approaches in the literature [2], we require that all loop bounds in the target function are known. This is needed by the DSE for estimating the kernel latency and by the roofline model generation for automatically deriving the peak performance and operational intensity.

The first step performed by our methodology involves the generation of the LLVM IR from the high-level software input code (such as C and C++). Subsequently, we analyze the LLVM IR to provide an initial performance and resource estimation. The performance is estimated by scheduling the kernel function and computing the latency of the critical path, whereas the resource usage is estimated considering the resource utilization of the operations within the schedule. In order to support this phase, our methodology features a performance and resource modeling library, simply referred as profiling library in the rest of the description, that contains the estimations of performance (latency, timing) and resource usage (such as BRAM, DSP, FF, LUT and area) reported by the synthesis tool used for the realization of the target hardware for operations synthesized at different frequencies.

Examples of synthesis tools are Vivado HLS/Vivado by Xilinx for the realization of an FPGA configuration and Catapult HLS by Mentor and Design Compiler by Synopsys to target an ASIC of a given technology.

In the next step, the workflow automatically generates the roofline model analysis and visualizes it to a web-based user interface where performance bounds, operational intensity and estimated performance of the initial design are shown in the same chart. At this point, the user may either restructure the code and try to overcome any memory bottleneck identified by the roofline model analysis or proceed with the automated DSE of optimization directives. In case the DSE is performed, the estimated performance of the best feasible design produced by the DSE is plotted directly to the roofline model chart. In this way, the user has a comprehensive view of the current design configuration both in terms of the potential achievable performance, either limited by the peak performance or bandwidth bound, and the actual performance of the solution derived by the DSE. Finally, the user has also the possibility to modify the code or specify manual optimization directives. The resulting code can be used as a baseline version for further iterations, where roofline model analysis and DSE are performed over. Overall, the proposed methodology allows the user to iteratively converge toward an optimal design while taking into account performance and memory bottleneck proper of the analyzed solutions. In the next Sections, we discuss in details the phases of our approach.

II. Performance and Resource Estimation

In this Section, we present a lightweight resource and performance estimation performed on the LLVM IR of the target code. The overall process relies on both built-in LLVM passes and custom passes needed to improve the accuracy of the estimations. In particular, we start by applying the standard O1-level optimizations from LLVM, which are also common in commercial high-level synthesis tools. Subsequently, we apply the following custom passes: unrolling of loops marked by the loop unrolling optimization directive, tree balancing of associative operators, analysis and propagation of constant memory accesses, range analysis for types manipulation, instruction redundancy elimination and resource mapping for multiply-add operations. Furthermore, we apply additional built-in LLVM passes (such as instcombine and gvn) that can further improve the quality of the code after the custom passes.

After code optimization, the function is scheduled in order to estimate its overall latency. The approach computes the arrival time of each basic block considering, recursively, the arrival times of its predecessors and the latency of the basic block itself. In case the predecessor is a complex structure such as a loop, its latency is computed by applying recursively the same approach on its basic blocks. The latency of the kernel function is obtained from the arrival time of the basic block where the function returns from the call. Moreover, the latency of a loop is obtained from the latency of the loop body according to the specific optimization directives. Since loop unrolling is applied directly as a code transformation, we only need to distinguish between pipelined and non pipelined loops. If no pipelining is applied, the loop latency is computed as the product of the iteration latency IL and the number of iterations N. For pipelined loops, instead, the loop latency is computed as IL+II*(N 1) where II is the initiation interval of the loop. In order to speedup the search, we approximate the II as the minimum initiation interval [14] without running time-consuming modulo scheduling algorithms [14]-[16]. We compute the minimum initiation interval [14] as MII=max (RecMII, ResMII) where RecMII and ResMII are the contributions relative to the recurrence-constrained minimum initiation interval and the resource-constrained minimum initiation interval. The RecMII is the constraint on the initiation interval given by loop-carried dependencies such as accumulations. It is calculated as RecMII=$\max_i$[$delay_i$/$distance_i$] where $delay_i$ is the delay in clock cycles along the dependency path of the i-th dependence and $distance_i$ the distance of the i-th recurrence through the loop iterations. The path considered for each dependence is the one starting from the destination operation to the source operation passing through the back edge. The ResMII, instead, is the constraint on the resource usage of limited functional units. In general, it is calculated as ResMII=$\max_i$[$numOps_i$/$numFUs_i$] where $numOps_i$ is the number of operations of type i in a loop and $numFUs_i$ is the number of available functional units of type i. Since in our case the constrained operations are the ones accessing memory and since memories can be partitioned, the formula can be rewritten as ResMII=max$_i$[numAccs$_i$/numPorts$_i$] where numAccs$_i$ is the number of accesses on the i-th partition and numPorts$_i$ is the number of ports available for accessing the i-th partition. The number of iterations N performed by a certain loop is equal to its trip count which is obtained from the LLVM scalar evolution analysis applied to the loop induction variables. However, in order to take into account the loop flattening optimization for perfectly nested loops containing a pipelined loop, we modify the assignment of loop iterations. In particular, for any perfect loop nests having a pipelined innermost loop, the number of iterations performed by the pipelined loop is equal to the product of the trip counts of all the loops within the loop nests, whereas, the other loops in the loop nest are assigned a number of iterations equal to 1. With this approach, we emulate the collapse of a loop nest to a single loop which occurs when loop flatting is performed.

Apart from the optimizations applied on the loop, the latency of a single iteration is obtained from the arrival time of its latch block, considering the header block as having no predecessors. Finally, the latency of a single basic block is computed with an adapted ALAP version of the Resource-Constrained List Scheduling algorithm, which includes instruction chaining. The algorithm imposes constraints on instructions accessing the same memory port in the same clock cycle. It takes into account accesses to partitioned arrays, modeled by instantiating one queue for each partition, and accesses to external AXI interfaces. Each queue has an index identifying the partition it models equal to (baseAddr, id$_1$, id$_2$, . . . , id$_{n-1}$) where baseAddr is the base address of the n-dimensional array being accessed and id$_i$ are partition indexes associated to each dimension i. Given a memory access to indexes index$_i$ for each dimension i, the corresponding queue being accessed is determined as follows:

id$_i$=[index$_i$/[size$_i$/f$_i$]] in case of block partitioning
id$_i$=(index$_i$)mod(f$_i$) in case of cyclic partitioning
id$_i$=index$_i$ in case of complete partitioning where size$_i$ is the size of dimension i and f$_i$ is the partitioning factor of dimension i. Once the kernel is scheduled, the entire resource consumption for each resource type specific of the target hardware device is estimated. In our model, we consider an amount of BRAM banks for allocating a certain array equal to $2^{\lceil log2(partitionSize/capacity) \rceil}$*partitions where partitionSize is the size in bits of each partition, capacity is the capacity of a BRAM bank and partitions is the overall number of partitions composing the array. The resource consumption given by the operators is taken from the profiling library, while considering resource sharing among instances of the same operators that start the computation in different clock cycles. Finally, we also model the LUT and FF usage due to multiplexing and routing logic introduced by resource sharing. Here follows a more detailed description on resource estimations:

1) Expressions: The instances of the expressions composing a certain algorithm can consume resources such as DSP, FF and LUT. Sharable operators executed in different clock cycles can be reused, saving resources but incrementing the routing complexity. For this reason we allow sharing of both expressions only make use of at least one DSP (usually is a quite critical resource) and complex operations with latency greater or equal than one. Since we consider sharable operators as fully pipelined, the number of instances required by a single operator in a certain basic block depends on the maximum number of instances of a certain operator starting their computation in the same clock cycle. This data, combined with the number of operators would be instantiated if reuse were not applied, allows us to compute the reuse rate of a certain operator. The number of instances required by unsharable operators, instead, depends just on the number of operators of that type used by the application. Once we have the number of instances required by the application, we multiply this amount with the estimated resource usage of a single instance given by the profiling library.

2) Partial results storage: Partial results of computations across clock cycles are stored in registers (FF). Therefore, we estimate the FF usage considering the instructions cannot be chained since the result has to be stored for further computations. The FF usage of a single instruction can be computed multiplying the amount of these instructions for the bitwidth of the operation and weighted with the reuse factor of that operator.

3) Shared resources routing: Sharing resources requires the usage of multiplexers for feeding the instance with the right operands. Since multiplexers are implemented with LUTs, we computed the number of LUTs needed for implementing a multiplexer with a given number of inputs and therefore we can compute the LUT usage for each instance assuming that for each operand is used a multiplexer with a number of input given by the reuse factor.

III. Automated Roofline Model Analysis

In this Section we discuss how we adapt the classic roofline model [7] to FPGA/ASIC and how we automatically compute the roofline model starting from a given code and target device. In the classic roofline model for CPU, both the peak bandwidth and the peak performance are dependent on the architecture, whereas, the operational intensity is a characteristic of the algorithm. However, when considering FPGA os ASIC, it is not accurate to provide a peak performance independent from the target computation to accelerate. Indeed, different operations require different resource consumption for their implementation in hardware. Hence, the number of processing elements that can be configured in parallel, and so the peak performance, strongly depends on the operations to perform. For this reason, we propose a methodology for computing the peak performance that accounts both for the algorithm and the target FPGA or ASIC technology. Furthermore, the computation of the roofline model is automated by means of a custom LLVM pass working on the IR of the high-level software code.

Despite fixed architectures (like CPUs) have performance metrics correlated the architecture itself (e.g. GFLOPs, Giga FLoating-point OPerations per second), reconfigurable architectures (like FPGAs) or ASICs better relate their performance metric to the algorithm to be synthesized (since the algorithm itself defines the target architecture once synthesized). For example, considering an image processing algorithm, a meaningful performance metric could be the number of processed images per second performed with the hardware implementation. For this reason, we allow the user to specify the preferred performance metric in two formats:

defining a set of operators that are to be measured (such as GFLOPs);

inserting a custom directive in the place of the code where a result is generated, defining in this way a throughput metric (results/s).

Practically, the throughput metric is specified inserting the custom directive _result_generation_( ) next to the instruction responsible for the calculation. We intend as operator (or simply op) the string identifying a single LLVM instruction (add, fmul, . . . ) despite for function calls (llvm::CallInst instructions) which it is supposed to be the name of the called function. Regardless of the performance metric format, we need to define the subset of operators of interest by the user. Therefore, we start defining the set OP of the operators composing the code and we name SOP ⊆ OP the set of operators of interest by the user. In case the first format is considered, the user directly defines the set of operators SOP that want to measure. In case the second format is considered, the set SOP={$op_r$} where $op_r$ is the single operator identifying the function call _result_generation_( ) needed for specifying the throughput. Implementing the algorithm, we define a (map) data structure $OP_{map}$ whose indexes are the elements of the set OP and the indexed items are the number of executions of the related index operator during the algorithm execution computed by static code analysis. We populate the OPmap analyzing the code by means of the LLVM framework. In detail, the analysis starts from the LLVM IR of the kernelfunction, goes trough each basic block bb which in turn goes through each contained instruction i.

For each basic block bb∈kernelfunction, the analysis computes the number of times the basic block is executed $e_{bb}$ considering the loop nest in which the basic block resides. Since it is assumed that loop bounds are known at compile time, we can compute the $e_{bb}$ with the Listing 2.

---

Listing 2: C++ code of the computeExeuctionTimes function needed for computing the number of times a certain basic block bb is executed

```
unsigned long long computeExecutionTimes(llvm::
    BasicBlock *bb) {
  llvm::LoopInfo *LI = &getAnalysis<llvm::
      LoopInfoWrapperPass> ( ) .getLoopInfo ( );
  llvm::ScalarEvolution *SE = &getAnalysis<llvm::
      ScalarEvolutionWrapperPass> ( ) .getSE ( );
  unsigned long long executionTimes = 1;
  llvm::Loop *parentLoop = LI->getLoopFor(bb);
  while (parentLoop != nullptr) {
    executionTimes *= SE->getSmallConstantTripCount(
        parent Loop);
    parentLoop = parent-Loop->getParentLoop( );
  }
  return executionTimes;
```

---

For each instruction i∈bb, the analysis:
computes the related operator $op_i$ (as described before),
checks whether the operator $op_i$ is already index of some value in the $OP_{map}$.
If so, the indexed value is incremented by $e_{bb}$ where bb is the basic block containing the instruction,
otherwise, the index $op_i$ is inserted in $OP_{map}$ with indexed value initialized $e_{bb}$ where bb is the basic block containing the instruction.

In a similar way, we also count the total number of memory accesses to function arguments mapped to, but not limited to, AXI master/slave interfaces and derive the total number of bytes tb accessed. The user specifies that a certain argument arg of function ƒ is mapped to an AXI master/slave interface inserting a directive _axi_master_(arg, bundle) into a function ƒ. We compute the number of transferred bytes considering all the llvm::LoadInst and llvm::StoreInst whose base address corresponds to a certain argument mapped to an AXI master/slave interface. In particular, initialize a variable tb to zero and for each basic block bb∈kernelfunction, the analysis computes the number of times the basic block is executed $e_{bb}$ considering the loop nest in which the basic block resides. Since we assume loop bounds known at compile time, we can compute the $e_{bb}$ with the Listing 2. For each instruction i∈bb, the analysis:
checks whether the instruction i is a llvm::LoadInst or llvm::StoreInst operation.
If so, check whether the base address is a function argument $arg_1$ of function ƒ.
If so, check whether there exists a function call instruction inside ƒ of the form _axi_master_(arg, bundle) without considering the value of bundle which is not relevant here.
If so, retrieve the amount of loaded or stored bytes $tb_i$ of instruction i considering the loaded and stored type and increment the value of tb by a factor of $tb_i$.

The value of tb after the analysis represents the total value of transferred bytes to and from the off-chip memory transfer during the kernel execution. Once computed $o_{op}$ and tb, we can automatically compute the operational intensity as follows:

$$CI = \sum_{op \in SOP} \frac{o_{op}}{tb} \quad (1)$$

The estimation of the peak performance is computed by assuming an ideal hardware implementation of the algorithm on the target hardware with no data dependencies across the algorithms operations. For each operation (e.g. a floating-point sum), we associate a corresponding operator (e.g. a floating-point adder) that is physically implemented on the hardware. We consider the operators as fully pipelined and working at the target clock frequency f. Hence, at each clock cycle, an operator can produce a valid result. We collect in a profiling library the estimations of performance and resource usage of several operators synthesized (offline) at a certain frequency on a target hardware, in particular a given FPGA or ASIC technology. In detail, for each target hardware and frequency, we build an instance of the profiling library associated to the several operators appearing in the code in order to let the framework load the right instance of the library according to the considered target frequency and target hardware, providing for each operator the latency (required clock cycles by the operator to complete), timing (maximum combinational time required by the slowest stadium of the operator to complete) and amount of resources needed for implementing the operator (like BRAM, DSP, FF, LUT and area). We build the profiling library synthesizing each single instruction composing the library by means of an HLS tool (same used for eventually generating the final design of our methodology). In particular, given a certain instruction of the form $a=ƒ(op_1, op_2, . . . , op_n)$ we rely on a template function for building the kernel further synthesized by the HLS tool for providing the needed estimations.

This template is the string kernel in Listing 3 representing the Python function for implementing the instance of the kernel function given the instruction to be synthesized and the input and output type of the instruction itself (other parameters not relevant here).

---

Listing 3: writeCppKernel Python function for generating a simple C++ HLS kernel consisting of a single instruction to be profiled

```
def writeCppKernel(iType, oType, instruction,
    projectRootPath, solutionNumber=1):
  kernel = """
```

Listing 3: writeCppKernel Python function for generating a simple C++
HLS kernel consisting of a single instruction to be profiled

```
#include "ap_int.h"
#include "ap_fixed.h"
#define iType """ + iType + """
#define oType """ + oType + """
oType innerKernel(iType v1, iType v2) {
   #pragma HLS INLINE off
   return """ + instruction + """;
}
void kernel(iType *x, iType *y, oType *z) {
   #pragma HLS INNTERFACE s_axilite port=x
   #pragma HLS INNTERFACE s_axilite port=y
   #pragma HLS INNTERFACE s_axilite port=z
   #pragma HLS INNTERFACE s_axilite port=return
   *z = innerKernel(*x, *y);
}
"""

f = open(projectRootPath + '/kernel.cpp', 'w' )
f.write(kernel)
f.close( )
return
```

Once the kernel has been synthesized, the tool reports the needed resources, latency and timing of the instruction of interest. Therefore, once the profiling library with target frequency and architecture corresponding to the current setting is loaded, the tool can start computing the peak performance. Ideally, an implementation with maximum performance on the target hardware would require to instantiate each operator as many times as the corresponding operations count $o_{op}$. Such implementation requires cr resources for each resource type $r \in R = \{BRAM, DSP, FF, LUT, area\}$:

$$c_r = \sum_{op \in OP} o_{op} \times u_{op,r} \quad (2)$$

where $u_{op,r}$ is the amount of resources of type $r \in R$ required by the operator $op \in OP$, which is provided by the profiling library just loaded. Most likely the required resources would largely exceed the hardware resource availability. Hence, we compute a scale factor to take into account the amount of resource reduction needed to fit within the target FPGA or within the given ASIC resource constraints (such as maximum area):

$$SF = \max_{r \in R} \frac{c_r}{av_r} \quad (3)$$

where $av_r$ is the amount of resources of type $r \in R$ available on the target hardware. The actual number of operators $i_{op}$ of type $op \in OP$ implemented in the design is scaled by a factor SF compared to the ideal implementation:

$$i_{op} = \frac{o_{op}}{SF} \quad (4)$$

and the peak performance bound (in terms of total number of operations per second) is computed as:

$$P = \sum_{op \in SOP} i_{op} \times f \quad (5)$$

The formula takes into account the fact that each operator can produce a useful result every clock cycle (pipelined operators) and that the operators are never idle (no data dependencies). Finally, within the roofline model chart we empirically consider as peak performance the 80% of P to take into account routing congestion and timing closure issues. Regarding the peak bandwidth bounds, we ran a set of microbenchmarks on the target FPGA or consider a bandwidth estimation when targeting an ASIC with given off-chip memory and memory interconnection. The microbenchmarks or estimations are performed considering different configurations for the communication interface between the accelerator and the off-chip memory. In particular, we consider several combinations of: number of DMA channels used, bitwidth of the AXI interfaces and burst length. In this fashion, according the configuration of the HLS interfaces for the given code, it is possible to derive an appropriate peak bandwidth bound. Finally, from a given peak bandwidth (bw) for transferring data to and from the memory of the hardware device, we can calculate the memory transfer performance bound as: Pm=bw*CI.

IV. Design Space Exploration

The several hardware design configurations are explored in an iterative way evaluating, by means of the approach described in Section II, the performance provided by a certain set of optimization directives in order to select the next directives configuration accordingly. Throughout the iterations, the directives configurations are saved in a stack, so that, if a certain configuration is not feasible due to resource constraints, the corresponding loop that led to exceed the available resources is marked as fully optimized and is not considered for subsequent optimizations. Then, the exploration backtracks to the previous feasible configuration and continues to search for other optimization opportunities on the other loops within the code.

Each iteration is performed:
  inserting the optimization directives in the LLVM IR to be analyzed;
  estimating the performance and resource usage of the current configuration;
  selecting the optimization directives to apply in the next iteration.

The choice of the next configuration to investigate is performed by a controller that alternates loop optimizations (through loop unrolling, pipelining and flattening) and local memory optimizations (through array partitioning). Regarding the loop optimizations, at each step, we recursively visit the loop with higher latency contained in the function body or loop until an innermost loop l is identified. If loop l is not already pipelined, we attempt to pipeline it first. This choice relies on the fact that pipelining a loop does not increase resource usage as much as the unrolling of the same, keeping the configuration feasible and faster to be analyzed. However, if l is already pipelined, the DSE tries to achieve higher performance by further unrolling the loop. Every subsequent unrolling optimization of a loop l is done by selecting the next higher unrolling factor that divides the trip count of the loop.

After every loop optimization, a global memory optimization follows. Indeed, after having pipelined or unrolled a loop, performance might now be constrained by the number of available memory ports. Within this step, for each array a in the function and for each dimension d of array a, we collect the number k of distinct offsets used to access dimension d. Then, we partition dimension d by a factor k. The selection among cyclic and block partitioning is done by simulating the number of conflicts that occur within the partitions. The partitioning type that minimizes the maximum number of conflicts per partition is selected. Notice that complete partitioning is automatically performed if either block or cyclic partitioning are applied with a factor of k equal to the number of elements in dimension d. Finally, the exploration continues with a loop optimization step and terminates when there are no more loops to explore, either because they are all completely unrolled or marked as fully optimized.

V. Experimental Evaluation

We evaluate our DSE for HLS optimization directives on the PolyBench test suite [17] and validate the whole methodology on the N-body physics simulation case study. The experiments are executed on a Intel Xeon E5-2680 v2, while we use Vivado HLS 2018.2 as a reference for resource and performance estimation comparisons.

A. PolyBench Test Suite

The PolyBench test suite [17] is a collection of benchmarks containing several kernels with different loop nests. Through these benchmarks we evaluate the DSE efficiency and estimation accuracy of our approach, comparing our results against [2]. In order to reproduce the settings of [2], we target a Xilinx Virtex-7 XC7V2000T-FLG1925 FPGA device running at 100 MHz. Furthermore, the latency and area results of [2] have been obtained by applying the optimal optimization directives reported in their work and running Vivado HLS 2018.2.

Table I summarizes the results achieved by the DSE. In particular, we report the execution time of our DSE on the different test cases comparing it with the execution time needed to run the same DSE approach but relying on Vivado HLS for the performance and resource estimation. The Table reports the size of the solution space (possible combinations of optimization directives for a given benchmark) and the number of designs needed by our DSE to converge to the final solution. As we can see, our DSE requires from 8× to 28× less time compared to the HLS-based solution while achieving the same final configurations. Furthermore, the DSE effectively explores a small number of interesting optimization configurations from a larger design space.

Table I also reports the improvement with respect to the baseline unoptimized HLS implementation and the result achieved by [2] in terms of reduction in the overall kernel latency. Furthermore, the Table shows the area utilization (computed considering the most constraining resource) of both our final designs and the ones from [2]. Overall, we can observe an average latency reduction of 7.53× compared to the optimal configurations found by [2], achieved in less than a minute. The main reason for the improved results comes from the additional code transformation applied during the resource and performance estimation phase and the policy adopted by the DSE controller. Since both [2] and our DSE do not explore optimizations that lead to exceeding the available resources, our accurate predictions prevent stopping the search too early, driving the exploration toward solutions exploiting, on average, 65.83% of the device area, 2.03× more than [2]. On the other side, alternating loop optimizations and array partitioning optimizations allows the DSE controller to fine tune the partitioning factors and types according to the array accesses.

Table II reports the optimal configurations found by our DSE and illustrates how our methodology identifies coherent array partitioning with the loop optimizations applied.

TABLE II

Optimal optimization directives configurations achieved by the proposed DSE on the PolyBench test suite.

| Benchmarks | Array | Optimizations |
|---|---|---|
| ATAX | 16 | L1: unroll (16), L1.1: unroll (16), L1.2: unroll (16) A, x, y, tmp: (complete, 16, 1), A: (complete 16, 2) |
| BICG | 32 | L1: unroll (8), pipeline A, q, r, tmp: (cyclic, 4, 1), p, s: (complete, 32, 1), A: (complete, 32, 2) |
| GEMM | 16 | L1: unroll (2), pipeline A, C: (cyclic, 2, 1), A, B, C: (complete, 16, 2), B: (complete, 16, 1) |

TABLE I

Results of our DSE for HLS optimization directives on the PolyBench test suite.

| Benchmark | DSE executive time [s] Ours | DSE executive time [s] HLS | Design space Exaustive | Design space Explored | Latency reduction w.r.t. baseline | Latency reduction w.r.t. [2] | Area usage [%] Ours | Area usage [%] [2] |
|---|---|---|---|---|---|---|---|---|
| ATAX | 12.39 | 348.97 | 3.28e+7 | 28 | 664.50× | 10.50× | 71.11 | 6.67 |
| BICG | 51.89 | 407.79 | 1.44e+8 | 20 | 396.13× | 4.50× | 71.11 | 11.11 |
| GEMM | 33.21 | 485.76 | 2.62e+9 | 24 | 1090.75× | 11.67× | 71.11 | 71.11 |
| GESUMMV | 21.68 | 335.40 | 2.1e+8 | 19 | 272.50× | 10.00× | 75.56 | 4.72 |
| MM | 23.84 | 658.8 | 1.59e+13 | 41 | 364.25× | 2.38× | 80.00 | 40.00 |
| MVT | 25.65 | 525.59 | 2.62e+9 | 33 | 140.25× | 2.14× | 35.55 | 53.33 |
| SYR2K | 56.22 | 857.06 | 2.62e+9 | 22 | 688.90× | 14.36× | 82.22 | 45.94 |
| SYRK | 48.24 | 737.63 | 4.1e+6 | 24 | 667.25× | 4.70× | 40.00 | 26.67 |

TABLE II-continued

Optimal optimization directives configurations achieved by the proposed DSE on the PolyBench test suite.

| Benchmarks | Array | Optimizations |
|---|---|---|
| GESUMMV | 16 | L1: unroll (16), L1.1: unroll (16) A, B, x, y, tmp: (complete, 16, 1), A, B: (complete, 16, 2) |
| MM | 8 | L1: unroll (4), pipeline, L2: unroll (4), pipeline A, D, tmp: (cyclic, 4, 1), B, C: (complete, 8, 1), A, B, C, D: (complete, 8, 2) |
| MVT | 16 | L1: unroll (8), pipeline, L2: unroll (8), pipeline x1, x2: (cyclic, 8, 1), A, y_1, y_2: (complete, 16, 1), A: (complete, 16, 2) |
| SYR2K | 16 | L1: pipeline A, B: (complete, 16, 1), A, B, C: (complete, 16, 2) |

TABLE II-continued

Optimal optimization directives configurations achieved
by the proposed DSE on the PolyBench test suite.

| Benchmarks | Array | Optimizations |
|---|---|---|
| SYRK | 16 | L1: pipeline A: (complete, 16, 1), A, C: (complete, 16, 2) |

Figure 2:
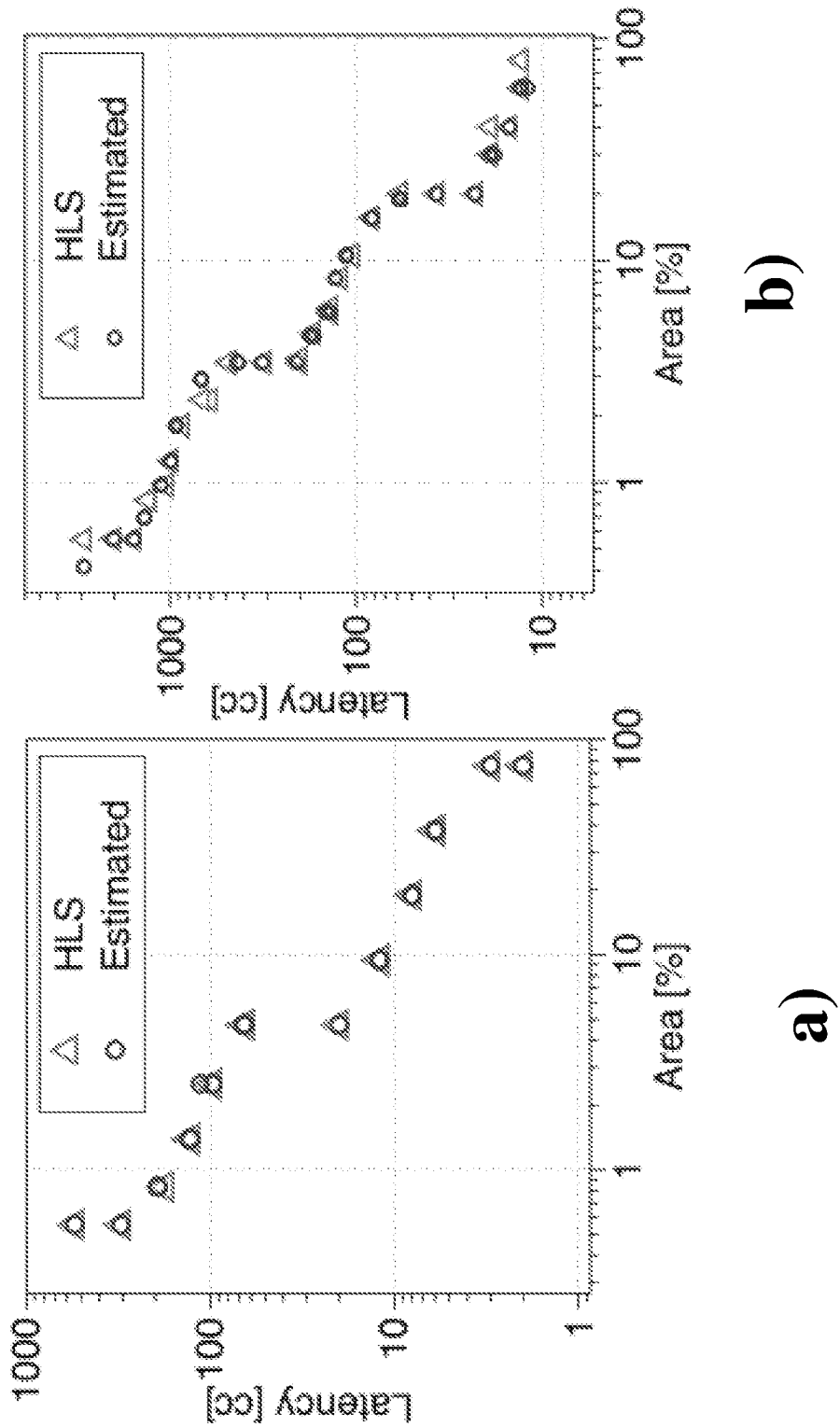
FIG. 2 shows Pareto charts of the designs explored by the DSE on two PolyBench test cases: a) Gesummv test case; b) Mm test case.

FIG. 2 describes the DSE process in terms of latency and area usage of two test cases, Gesummv and Mm. We focus on these test cases as they required the lowest and the highest number of DSE iterations to converge, respectively. The first test case (Gesummv) explores the design space with a prediction error of 1.90% in performance and 1.24% in resource usage whereas the second test case (Mm) provides a prediction error of 4.08% in performance and 5.60% in resource usage. For each graph, the curve obtained interpolating all the designs shows how the DSE controller alternates loop pipelining (steep traits) and loop unrolling (linear traits) and converges to a 75.56% and 80% of area utilization respectively.

B. N-Body Simulation Test Case

In order to validate the overall methodology we consider the N-body physics simulation, a real application from the astrophysics domain. We started the optimization process from a basic memory bound implementation of the algorithm and, by means of our methodology, we achieved a final version with performance comparable to [18] but following an automated approach. For the this test case, we target a Xilinx Virtex UltraScale+ VU9P FPGA board on Amazon Web Service (AWS) with a target design frequency of 126 MHz.

Figure 3:
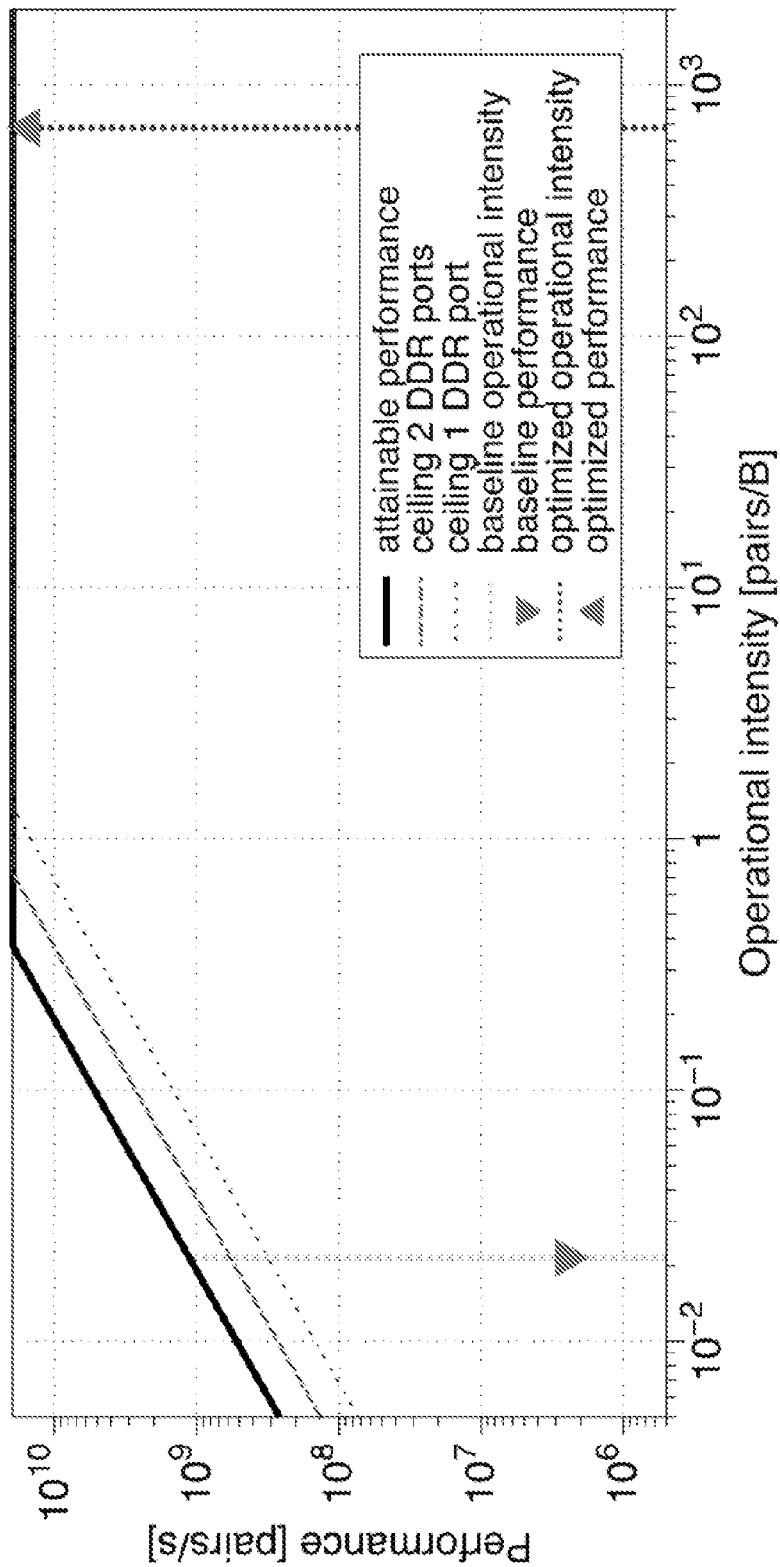
FIG. 3 is a graph of a Roofline model representing an optimization process for the N-body algorithm.

Before starting the optimization process, we need to specify the throughput metric. This step is performed by inserting a custom directive in the code where a result of interest (a body comparison in this case) is produced. We now analyze the plain version of the algorithm by means of our methodology, reporting all the steps in FIG. 3. The plotted roofline analysis clearly visualizes that the initial design is memory bound (green dotted line in FIG. 3). Indeed, the chart reports an operational intensity of 2.15e-2 pairs/B, well below the ridge point of 1.35 pairs/B. In addition, our methodology estimates for the initial implementation a performance of 2.52e+6 pairs/s (red triangle on the green dotted line in FIG. 3). However, for the current operational intensity and available memory bandwidth (14.5 GB/s with 1 DDR port), the roofline model reports an attainable performance of 3.12e+8 pairs/s due to the bound on memory transfer (accuracy of benchmark-based estimations of peak bandwidth extensively discussed in [8][11][19]). This implies that the DSE can only find designs with performance lower than 3.12e+8 pairs/s, which, in turn, is definitely lower than the estimated peak performance of 1.57e+10 pairs/s that could be reached in the compute bound area. For this reason, we try to improve the operational intensity in order to cross the ridge point.

In particular, we consider caching data in local memories for increasing the operational intensity. We rewrite the kernel adding an initial phase for copying the data into the local memories before the computation and a final phase for copying the data to the host after the computation.

Analyzing the cached version of the algorithm, we verify that the BRAM resource constraints are satisfied and the operational intensity grows to 6.77e+2 pairs/B (blue dotted line in FIG. 3), reaching the compute bound area. According to the roofline model, with the newer implementation we expect to find a design with performance limited by the peak performance (1.57e+10 pairs/s). By running the automated DSE, we obtain an optimal design with estimated performance of 1.51e+10 pairs/s (red triangle on blue dotted line in FIG. 3) with a 75.57% of area usage, a solution whose estimated performance is only 3.7% below the theoretical bound. Moreover, the estimations on the final design report a latency estimation error of 0.000298%. Finally, we tested the obtained design on-board and measured 1.207e+10 pairs/s, which is approximately 20% less than both the DSE and the Vivado HLS estimates due to memory transfer overheads. With respect to the implementations in the State of the Art, the work in [18] achieves 1.3441e+10 pairs/s with a tailored implementation, whereas we provide a solution resulting from an automated exploration with just 8.98% loss in performance. This disclosure provides a comprehensive methodology for the optimization of high-level software code to realize a ASIC hardware implementation or FPGA configuration to meet the target performance requirements. The disclosed approach combines an automatic generation of a roofline model analysis for FPGA/ASIC, which allows to identify the candidate FPGA or ASIC technology among a given set and to quickly identify if the application is memory or compute bound, and an automated DSE for the identification of an optimal set of HLS optimization directives. The DSE efficiency has been evaluated on the PolyBench test suite, outperforming solutions in the literature achieving up to 14.36× reduction in kernel latency. Moreover, the whole methodology has been validated on a real application from the astrophysics domain and obtained a solution with performance comparable to a bespoke implementation in the State of the Art.

REFERENCES

[1] D. F. Bacon, R. M. Rabbah, S. Shukla et al., "Fpga programming for the masses." Commun. ACM, vol. 56, no. 4, pp. 56-63, 2013.

[2] J. Zhao, L. Feng, S. Sinha, W. Zhang, Y. Liang, and B. He, "Comba: A comprehensive model-based analysis framework for high level synthesis of real applications," in Proceedings of the 36th International Confer-ence on Computer-Aided Design. IEEE Press, 2017, pp. 430-437.

[3] G. Zhong, A. Prakash, Y. Liang, T. Mitra, and S. Niar, "Lin-analyzer: a high-level performance analysis tool for fpga-based accelerators," in Proceedings of the 53rd Annual Design Automation Conference. ACM, 2016, p. 136.

[4] G. Zhong, V. Venkataramani, Y. Liang, T. Mitra, and S. Niar, "Design space exploration of multiple loops on fpgas using high level synthesis," in 2014 IEEE 32nd International Conference on Computer Design (ICCD), October 2014, pp. 456-463.

[5] J. Cong, P. Wei, C. H. Yu, and P. Zhang, "Automated accelerator generation and optimization with composable, parallel and pipeline architecture," in 2018 55th ACM/ESDA/IEEE Design Automation Con-ference (DAC). IEEE, 2018, pp. 1-6.

[6] L. Wirbel, "Xilinx sdaccel: a unified development environment for tomorrow's data center," Technical Report, The Linley Group Inc, Tech. Rep., 2014.

[7] S. Williams, A. Waterman, and D. Patterson, "Roofline: An insightful visual performance model for multicore architectures," Commun. ACM, vol. 52, no. 4, pp. 65-76, April 2009. [Online]. Available: http://doi.acm.org/10.1145/1498765.1498785

[8] B. da Silva, A. Braeken, E. H. D'Hollander, and A. Touhafi, "Performance modeling for fpgas: Extending the roofline model with high-level synthesis tools," Int. J. Reconfig. Comput., vol. 2013, pp. 7:7-7:7, January 2013. [Online]. Available: http://dx.doi.org/10.1155/2013/428078

[9] C. Lattner and V. Adve, "Llvm: A compilation framework for lifelong program analysis & transformation," in Proceedings of the international symposium on Code generation and optimization: feedback-directed and runtime optimization. IEEE Computer Society, 2004, p. 75.

[10] J. Oppermann, A. Koch, T. Yu, and O. Sinnen, "Domain-specific optimisation for the high-level synthesis of cellml-based simulation accelerators," in 2015 25th International Conference on Field Programmable Logic and Applications (FPL). IEEE, 2015, pp. 1-7.

[11] S. Muralidharan, K. O'Brien, and C. Lalanne, "A semi-automated tool flow for roofline analysis of opencl kernels on accelerators," in First International Workshop on Heterogeneous High-performance Reconfigurable Computing (H2RC '15), 2015.

[12] J. de Fine Licht, K. F. Larsen, T. Hoefler, and S. Ramos, "Modeling and implementing high performance programs on fpga," Master's thesis, University of Copenhagen, Department of Computer Science, 2016.

[13] Xilinx Inc., "Vivado HLS." [Online]. Available: https://www.xilinx.com/products/design-tools/vivado/integration/esl-design.html

[14] J. M. Codina, J. Llosa, and A. Gonza'lez, "A comparative study of modulo scheduling techniques," in Proceedings of the 16th international conference on Supercomputing. ACM, 2002, pp. 97-106.

[15] L. de Souza Rosa, C. Bouganis, and V. Bonato, "Scaling up modulo scheduling for high-level synthesis," IEEE Transactions on ComputerAided Design of Integrated Circuits and Systems, pp. 1-1, 2018.

[16] J. Cong and Z. Zhang, "An efficient and versatile scheduling algorithm based on sdc formulation," in 2006 43rd ACM/IEEE Design Automation Conference. IEEE, 2006, pp. 433-438.

[17] L.-N. Pouchet, "Polybench: The polyhedral benchmark suite," URL: http://www.cs.ucla.edu/pouchet/software/polybench, 2012.

[18] E. Del Sozzo, M. Rabozzi, L. Di Tucci, D. Sciuto, and M. D. Santam-brogio, "A scalable fpga design for cloud n-body simulation," in 2018 IEEE 29th International Conference on Application-specific Systems, Architectures and Processors (ASAP). IEEE, 2018, pp. 1-8.

[19] L. Di Tucci, K. O'Brien, M. Blott, and M. D. Santam-brogio, "Architectural optimizations for high performance and energy efficient smith-waterman implementation on fpgas using opencl," in Design, Automation & Test in Europe Conference & Exhibition (DATE), 2017. IEEE, 2017, pp. 716-721.

[20] C. Lattner, "LLVM and Clang: Next Generation Compiler Technology," In The BSD Conference, May 2008.

The invention claimed is:

1. A computer-implemented method of realizing a hardware device for executing operations defined by a high-level software code, the method comprising the steps of:
    translating said high-level software code into a corresponding low-level software code for executing the same operations defined by the high-level software code, wherein said low-level software code defines low-level operations;
    for each hardware device of a set of hardware devices that can be manufactured or configured for executing said low-level software code, carrying out the following operations:
        estimating, for each low-level operation and for each type of hardware resources of said hardware device, an usage amount of hardware resources of said type required for implementing said low-level operation with said hardware device, wherein said estimating step is carried out assuming that there are no data dependencies among said low-level operations,
        for each low-level operation of said low-level operations, estimating a number of run-time occurrences of said low-level operation in said low-level software code,
        calculating, for each type of said available hardware resources a corresponding number of required hardware resources of said type as the summation, over all said low-level operations, of the product between the number of run-time occurrence of said low-level operation and the corresponding usage amount of said type of available hardware resources,
        calculating, for each type of said available hardware resources, a corresponding ratio between said number of required hardware resources and a defined amount of the available hardware resources in said hardware device of said type of available hardware resources,
        calculating a scale factor for said hardware device as a maximum value of said ratios calculated in the previous step,
        calculating a peak performance value of said hardware device as a summation, over all said low-level operations, of the product of said number of run-time occurrence of said low-level operations by a rate defining a number of low-level operations per second that may be carried out by the hardware device, divided by said scale factor;
        choosing the hardware device to be manufactured or configured out of said set of hardware devices that may be manufactured or configured, depending upon said respective peak performance value calculated for each hardware device of said set;
    manufacturing or configuring said hardware device, chosen in the previous step, to carry out said high-level software code.

2. The method of claim 1, wherein, for each hardware device of said set, the method comprises the steps of:
    estimating a total number of bytes of data to be transferred to and from a memory of said hardware device when the software code is executed,
    calculating an operational intensity of the low-level software code as a summation, over all said low-level operations, of the ratios between the number of run-time occurrences ($o_{op}$) of said low-level operation and total number of bytes of data to be transferred to and from the memory,
    estimating a maximum bandwidth for transferring data to and from the memory of said hardware device,
    calculating a memory transfer performance value of said hardware device as the product of said operational intensity by said maximum bandwidth,
    choosing the hardware device of said set to be manufactured or configured, also depending upon said respective memory transfer performance value calculated for each hardware device of said set.

3. The method of claim 2, wherein said hardware device is configured on a FPGA or manufactured as an ASIC and said step of realizing said hardware device comprises the step of executing a Design Space Exploration algorithm on said low-level software code for identifying a suitable FPGA configuration or an ASIC based on said peak performance value and memory transfer performance value to be met.

4. The method of claim 2, wherein said operational intensity are calculated over a sub set of low-level operations of said low-level operations of the low-level software code.

5. The method of claim 1, wherein said low-level software code is generated by:
- transforming, with a LLVM front-end compiler, said high-level software code into said low-level software code;
- processing said low-level software code with a LLVM compiler for estimating said number of run-time occurrences and said usage amount.

6. The method of claim 1, further comprising the step of estimating said usage amount of each type of hardware resources of said hardware device by a resource estimation algorithm for each low-level operation of said low-level operations.

7. The method of claim 1, wherein said type of hardware resources are Block RAM, DSP, Flip-Flops, Look Up Tables and area.

8. The method of claim 1, wherein said peak performance value is calculated over a subset of low-level operations of said low-level operations of the low-level software code.

* * * * *